US006960397B2

(12) United States Patent
Lee et al.

(10) Patent No.: US 6,960,397 B2
(45) Date of Patent: Nov. 1, 2005

(54) MAGNETORESISTANCE DEVICE

(75) Inventors: Seong Rae Lee, Seoul (KR); Chul Min Choi, Seoul (KR); Jong Soo Kim, Incheon (KR); Jin Oh Song, Seoul (KR); Sung Min Park, Seoul (KR); Dong Hwan Kim, Seoul (KR)

(73) Assignee: Korea Chungang Educational Foundation, Seoul (KR)

( * ) Notice: Subject to any disclaimer, the term of this patent is extended or adjusted under 35 U.S.C. 154(b) by 0 days.

(21) Appl. No.: 10/765,970

(22) Filed: Jan. 29, 2004

(65) Prior Publication Data

US 2004/0229082 A1 Nov. 18, 2004

(30) Foreign Application Priority Data

| Jan. 29, 2003 | (KR) | 10-2003-0005915 |
| Oct. 7, 2003 | (KR) | 10-2003-0069701 |
| Oct. 7, 2003 | (KR) | 10-2003-0069700 |
| Jan. 19, 2004 | (KR) | 10-2004-0003812 |
| Jan. 19, 2004 | (KR) | 10-2004-0003811 |

(51) Int. Cl.$^7$ ............... G11B 5/33; B32B 9/00
(52) U.S. Cl. .............. 428/689; 428/692; 360/324; 360/324.1; 360/324.2
(58) Field of Search ............... 428/689, 692, 428/492; 360/324, 324.1, 324.2

(56) References Cited

U.S. PATENT DOCUMENTS

| 6,052,263 | A  | * | 4/2000 | Gill ................. 360/324.11 |
| 6,709,767 | B2 | * | 3/2004 | Lin et al. ............. 428/611 |
| 2004/0184199 | A1 | * | 9/2004 | Nakashio et al. ...... 360/324.2 |

OTHER PUBLICATIONS

"Low–Resistance spin–dependant tunnel junctions with ZrAlOx barriers" Applied Physics Letters, vol. 79, No. 2, Dec. 31, 2001, pp. 4553–4555.*

* cited by examiner

Primary Examiner—Holly Rickman
(74) Attorney, Agent, or Firm—Rothwell, Figg Ernst & Manbeck

(57) ABSTRACT

Provided is a magnetoresistance device. The device includes a substrate, a lower layer formed on the substrate, and a magnetoresistance structure formed on the lower layer, and the lower layer is formed of amorphous $Zr_xAl_{1-x}$ ($0<x<1$) or $Zr_xAl_{1-x}O_y$ ($0<x<1$, $0<y<1$). In a tunneling magnetoresistance (TMR) device, a tunneling barrier layer is formed of at least one selected from the group consisting of $Zr_xAl_{1-x}O_y$ ($0<x<1$, $0<y<1$), $Ti_xAl_{1-x}O_y$ ($0<x<1$, $0<y<1$), and $Nb_xAl_{1-x}O_y$ ($0<x<1$, $0<y<1$).

18 Claims, 10 Drawing Sheets

MAGNETORESISTANCE DEVICE

BACKGROUND OF THE INVENTION

1. Field of the Invention

The present invention relates to a magnetoresistance device, and more particularly, to a magnetoresistance device with an improved MR characteristic and thermal stability, obtained by adjusting a composition of an upper layer, a lower layer, or a tunneling barrier layer of the magnetoresistance device.

2. Description of the Related Art

The operational principle of a magnetoresistance device is based on the way an electrical resistance of a specific material is varied in the presence of a magnetic field. In recent years, with the rapid developments in thin-film deposition techniques and surface processing techniques in ultra-high vacuum, it has become possible to finely grow a magnetic thin film to a thickness of several nanometers(nm), which is the equivalent of an interaction distance between spins, and therefore to manufacture a high-performance magnetoresistance device. Thus, various phenomena that had not been seen in bulk-type magnetic materials were found and began to be applied in household appliances and industrial components. For example, a magnetic recording head and a magnetic random access memory (MRAM) are kinds of high-performance magnetoresistance devices for writing data on an ultra-high-density data storage device.

Other examples of high-performance magnetoresistance devices widely used are a magnetoresistance head, which is used to read/record data stored on a data storage medium such as a hard disk drive (HDD), a giant magnetoresistance head (GMR head), and a tunneling magnetoresistance head (TMR head).

In the GMR head, a resistance is varied according to magnetization arrangements of two magnetic layers, which can be explained using a spin dependent scattering. Also, in the TMR head, a tunneling current is varied according to a relative magnetization direction of a ferromagnetic material in a structure formed of two magnetic layers and an insulator therebetween.

FIGS. 1A and 1B are cross-sectional views of a conventional magnetoresistance device. FIG. 1A illustrates a conventional GMR device. Typically, the GMR device is widely used as a spin valve magnetoresistance device. The spin valve magnetoresistance device has various shapes and thus is not limited to the shape shown in FIG. 1A.

Referring to FIG. 1A, a spin valve magnetoresistance device 10 comprises a lower layer 12, a first ferromagnetic layer 13, a spacer layer 14, a second ferromagnetic layer 15, a semi-ferromagnetic layer 16, and an upper layer 17, which are sequentially stacked on a substrate 11, for example, a Si wafer. The lower layer 12 is typically formed of tantalum (Ta). The first ferromagnetic layer 13 is formed of a ferromagnetic material, such as a CoFe alloy and is referred as a free layer since its magnetization direction is varied by an applied magnetic field. The spacer layer 14 is formed of a nonmagnetic material, such as Cu, and separates the first ferromagnetic layer 13 from the second ferromagnetic layer 15. The second ferromagnetic layer 15 is formed of a ferromagnetic material, such as a CoFe alloy and is referred to as a fixed layer. The semi-ferromagnetic layer 16 is mainly formed of a Mn alloy, such as an IrMn alloy, a FeMn alloy, or a NiMn alloy, and used to fix a magnetization direction of the second ferromagnetic layer 15. The semi-ferromagnetic layer 16 constitutes a sensing portion along with the first ferromagnetic layer 13, the spacer layer 14, and the second ferromagnetic layer 15. The upper layer 17, which protects the sensing portion formed thereunder, is mainly formed of tantalum.

The operation of the above-described magnetoresistance device is as follows. If an external magnetic field is applied to the magnetoresistance device, a magnetized direction of the second magnetoresistance layer 13 and a magnetized direction of the second ferromagnetic layer 15 are varied. Thus, a magnetoresistance between the first ferromagnetic layer 13 and the second ferromagnetic layer 15 is varied. This variation in the magnetoresistance enables sensing of magnetic data stored on a magnetic recording medium, such as an HDD. In such a manner, data can be read from the magnetic recording medium using the variation in the magnetoresistance between the first and second ferromagnetic layers 13 and 15. When the magnetoresistance device is used, a magnetoresistive (MR) ratio of a varied magnetoresistance to a minimum magnetoresistance and an exchange coupling force $H_{ex}$, i.e., a force required for a semi-ferromagnetic layer, to fix a magnetized direction of a second ferromagnetic layer should be maintained stable.

FIG. 1B illustrates a conventional TMR device 100. Referring to FIG. 1, the TMR device 100 comprises a lower layer 12, a first ferromagnetic layer 13, a tunneling barrier layer 18, a second ferromagnetic layer 15, a semi-ferromagnetic layer 16, and an upper layer 17, which are sequentially stacked on a substrate 11. In the TMR device 100, a tunneling current is varied according to a relative magnetization direction of a ferromagnetic material. Here, an MR ratio can be expressed as in the following Equation.

$$MR ratio = \frac{highMR - lowMR}{lowMR} \quad (1)$$

A high MR ratio facilitates determining the spin directions of a fixed layer and a free layer. Thus, magnetoresistance devices that reliably record and reproduce data as "1s" and "0s" can be manufactured.

The manufacture of magnetoresistance devices with a high MR ratio requires formation of a barrier layer that has no pinholes, a low roughness of about 2 Å root-mean square or less, and a good insulating characteristic. To form a high-quality barrier layer, methods of setting optimal oxidation conditions or methods of forming a barrier layer using new materials are conventionally used.

The methods of setting optimal oxidation conditions are native oxidation, plasma oxidation, and ultraviolet oxidation. The native oxidation has advantages of a good surface morphology and a low resistance but lacks reproducibility and requires a prolonged process. Also, while the plasma oxidation enables a quick and simple process and reliable reproducibility, the resulting barrier layer has a non-uniform surface. Also, the ultraviolet oxidation allows formation of low-resistance devices but requires a prolonged process.

In the methods using new materials, barrier layers are formed of $Ga_2O_3$, AlN, AlON, $TaO_x$, $ZrO_x$, or $MgO_x$. The barrier layers formed of these new materials have their advantages and disadvantages. That is, a $Ga_2O_3$ barrier layer, which has a low resistance, makes it impossible to measure its MR characteristic. An AlN barrier layer or an AlON barrier has a low bias voltage dependence but has a high resistance. A $TaO_x$ barrier layer facilitates coupling between a ferromagnetic layer and an insulating layer but has a low MR characteristic. A $ZrO_x$ barrier layer has an advantage of a low height as well as a disadvantage of a low MR characteristic. Also, while a $MgO_x$ layer has a low resistance and a small coupling between intermediate layers, it cannot be deposited beyond a limited height.

Meanwhile, sometimes a magnetoresistance device overheats during its manufacture or use. During use, a magnetoresistance device heats up to a temperature of about 150° C. due to an applied external current, and even to a higher temperature. During manufacture, the magnetoresistance device is heated to a temperature of about 300° C., which is higher than the temperature during use. If the magnetoresistance device is heated to a high temperature, atoms in each layer begin to move very actively, thus generating interdiffusion or intermixing of atoms between adjacent layers. The interdiffusion or intermixing of atoms is greatly affected by roughness of an interface between adjacent layers and the size of crystalline grains. More importantly, the principal characteristics of a magnetoresistance device, such as an MR ratio or an exchange coupling force, may be degraded due to the interdiffusion or intermixing.

In the above-described conventional magnetoresistance devices 10 and 100, if they are heated to a high temperature, the principal characteristics such as the MR ratio or the exchange coupling force are greatly reduced because of very active interdiffusion or intermixing. Also, incorrect sensing of magnetic information frequently occurs during use. In particular, a high-density magnetic recording medium, an applied magnetic field of which is small, has more serious problems.

Therefore, a magnetoresistance device requires a structure to prevent degradation of an MR ratio or an exchange coupling force even if a magnetoresistance thereof is heated to a high temperature. The above-described problems may occur in all kinds of magnetoresistance devices, such as magnetoresistance heads and MRAMs.

SUMMARY OF THE INVENTION

The present invention provides a magnetoresistance device with an improved MR characteristic and thermal stability.

According to an aspect of the present invention, there is provided a magnetoresistance device comprising a substrate, a lower layer formed on the substrate, and a magnetoresistance structure formed on the lower layer. The lower layer is formed of amorphous $Zr_xAl_{1-x}$ (0<x<1) or $Zr_xAl_{1-x}$ (0<x<1, 0<y<1).

The magnetoresistance device further comprises an upper layer formed on the magnetoresistance structure, the upper layer formed of amorphous $Zr_xAl_{1-x}$ (0<x<1) or $Zr_xAl_{1-x}O_y$ (0<x<1, 0<y<1).

The magnetoresistance structure can comprise a first ferromagnetic layer of which magnetization direction is varied by an applied magnetic field; a spacer layer formed on the first ferromagnetic layer, the spacer layer formed of an nonmagnetic material; a second ferromagnetic layer formed on the spacer layer, the second ferromagnetic layer of which magnetization direction is fixed; and a semi-ferromagnetic layer formed on the second ferromagnetic layer, the semi-ferromagnetic layer for fixing the magnetization direction of the second ferromagnetic layer.

The magnetoresistance structure can comprise a semi-ferromagnetic layer; a first ferromagnetic layer formed on the semi-ferromagnetic layer, the first ferromagnetic layer of which magnetization direction is fixed by the semi-ferromagnetic layer; a spacer layer formed on the first ferromagnetic layer, the spacer layer formed of an nonmagnetic material; and a second ferromagnetic layer formed on the spacer layer, the second ferromagnetic layer of which magnetization direction is varied by an applied magnetic field.

The magnetoresistance structure can comprise a first ferromagnetic layer of which magnetization direction is varied by an applied magnetic field; a tunneling barrier layer formed on the first ferromagnetic layer; a second ferromagnetic layer formed on the tunneling barrier layer, the second ferromagnetic layer of which magnetization direction is fixed; and a semi-ferromagnetic layer formed on the second ferromagnetic layer, the semi-ferromagnetic layer for fixing the magnetization direction of the second ferromagnetic layer.

The magnetoresistance structure can comprise a semi-ferromagnetic layer; a first ferromagnetic layer formed on the semi-ferromagnetic layer, the first ferromagnetic layer of which magnetization direction is fixed by the semi-ferromagnetic layer; a tunneling barrier layer formed on the first ferromagnetic layer; and a second ferromagnetic layer formed on the tunneling barrier layer, the second ferromagnetic layer of which magnetization direction is varied by an applied magnetic field.

According to another aspect of the present invention, there is provided a magnetoresistance device comprising a substrate, a magnetoresistance structure formed on the substrate, and an upper layer formed on the magnetoresistance structure. The upper layer is formed of amorphous $Zr_xAl_{1-x}$ (0<x<1) or $Zr_xAl_{1-x}O_y$ (0<x<1, 0<y<1).

The magnetoresistance structure can comprise a first ferromagnetic layer of which magnetization direction is varied by an applied magnetic field; a spacer layer formed on the first ferromagnetic layer, the spacer layer formed of an nonmagnetic material; a second ferromagnetic layer formed on the spacer layer, the second ferromagnetic layer of which magnetization direction is fixed; and a semi-ferromagnetic layer formed on the second ferromagnetic layer, the semi-ferromagnetic layer for fixing the magnetization direction of the second ferromagnetic layer.

The magnetoresistance structure can comprise a semi-ferromagnetic layer; a first ferromagnetic layer formed on the semi-ferromagnetic layer, the first ferromagnetic layer of which magnetization direction is fixed by the semi-ferromagnetic layer; a spacer layer formed on the first ferromagnetic layer, the spacer layer formed of an nonmagnetic material; and a second ferromagnetic layer formed on the spacer layer, the second ferromagnetic layer of which magnetization direction is varied by an applied magnetic field.

The magnetoresistance structure can comprise a first ferromagnetic layer of which magnetization direction is varied by an applied magnetic field; a tunneling barrier layer formed on the first ferromagnetic layer; a second ferromagnetic layer formed on the tunneling barrier layer, the second ferromagnetic layer of which magnetization direction is fixed; and a semi-ferromagnetic layer formed on the second ferromagnetic layer, the semi-ferromagnetic layer for fixing the magnetization direction of the second ferromagnetic layer.

The magnetoresistance structure can comprise a semi-ferromagnetic layer; a first ferromagnetic layer formed on the semi-ferromagnetic layer, the first ferromagnetic layer of which magnetization direction is fixed by the semi-ferromagnetic layer; a tunneling barrier layer formed on the first ferromagnetic layer; and a second ferromagnetic layer formed on the tunneling barrier layer, the second ferromagnetic layer of which magnetization direction is varied by an applied magnetic field.

According to yet another aspect of the present invention, there is provided a magnetoresistance device comprising a magnetoresistance structure formed of a fixed layer of which magnetization direction is fixed by a semi-ferromagnetic layer, a free layer of which magnetization direction is varied, and a tunneling barrier layer formed between the fixed layer and the free layer. The tunneling barrier layer is formed of at least one selected from the group consisting of $Zr_xAl_{1-x}O_y$ (0<x<1, 0<y<1), $Ti_xAl_{1-x}O_y$ (0<x<1, 0<y<1), and $Nb_xAl_{1-x}O_y$ (0<x<1, 0<y<1).

The magnetoresistance structure can comprise a first ferromagnetic layer of which magnetization direction is varied by an applied magnetic field; the tunneling barrier layer formed on the first ferromagnetic layer; a second ferromagnetic layer formed on the tunneling barrier layer, the second ferromagnetic layer of which magnetization direction is fixed; and a semi-ferromagnetic layer formed on the second ferromagnetic layer, the semi-ferromagnetic layer for fixing the magnetization direction of the second ferromagnetic layer.

The magnetoresistance structure can comprise a semi-ferromagnetic layer; a first ferromagnetic layer formed on the semi-ferromagnetic layer, the first ferromagnetic layer of which magnetization direction is fixed by the semi-ferromagnetic layer; the tunneling barrier layer formed on the first ferromagnetic layer; and a second ferromagnetic layer formed on the tunneling barrier layer, the second ferromagnetic layer of which magnetization direction is varied by an applied magnetic field.

DETAILED DESCRIPTION OF THE INVENTION

The present invention will now be described more fully with reference to the accompanying drawings, in which exemplary embodiments of the present invention are shown.

Figure 1A:
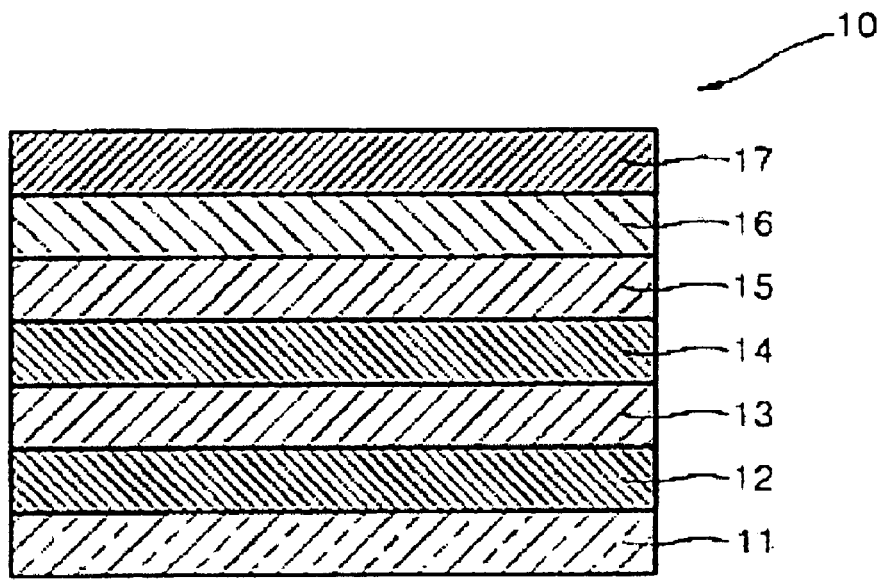
FIGS. 1A and 1B are cross-sectional views of conventional magnetoresistance devices.
Figure 1B:
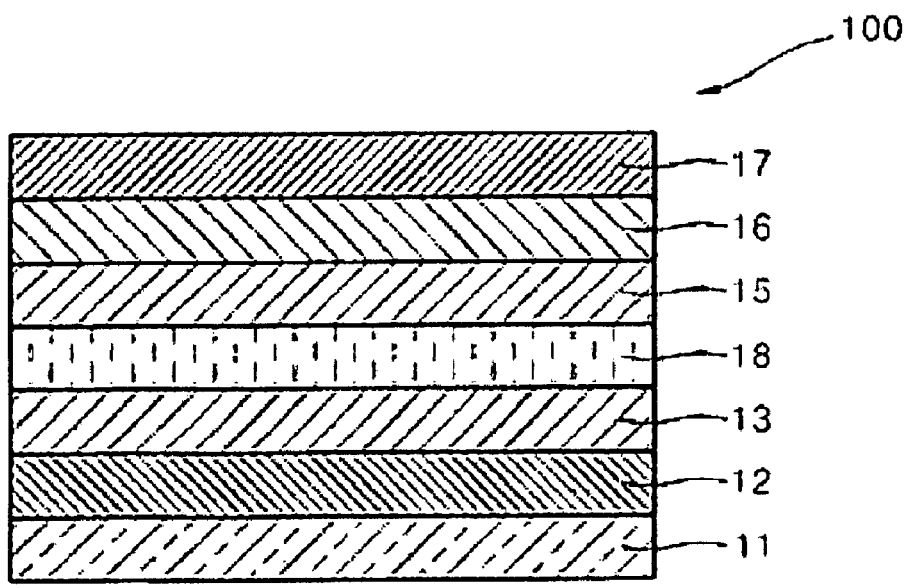
Figure 2:
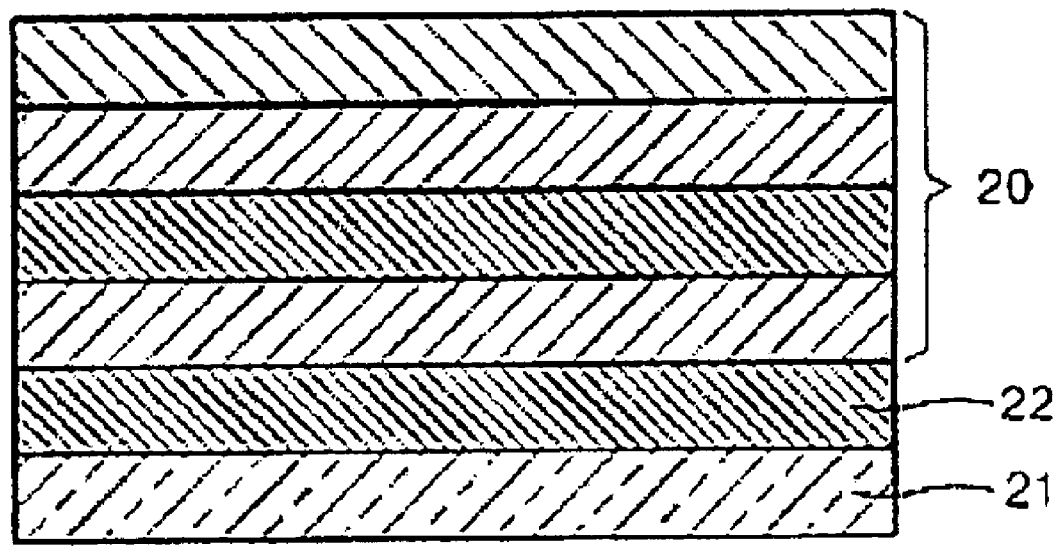
FIG. 2 is a magnetoresistance device according to the present invention.

FIG. 2 is a schematic cross-sectional view of a magnetoresistance device according to the present invention. Referring to FIG. 2, the magnetoresistance device comprises a substrate 21, a lower layer 22 formed on the substrate 21, and a magnetoresistance structure 20 comprised of magnetic layers and nonmagnetic layers which are sequentially formed on the lower layer 22. If the magnetoresistance device is a magnetoresistance head, the magnetoresistance structure 20 is a sensor. If the magnetoresistance device is an MRAM, the structure 20 is a memory portion.

Figure 3A:
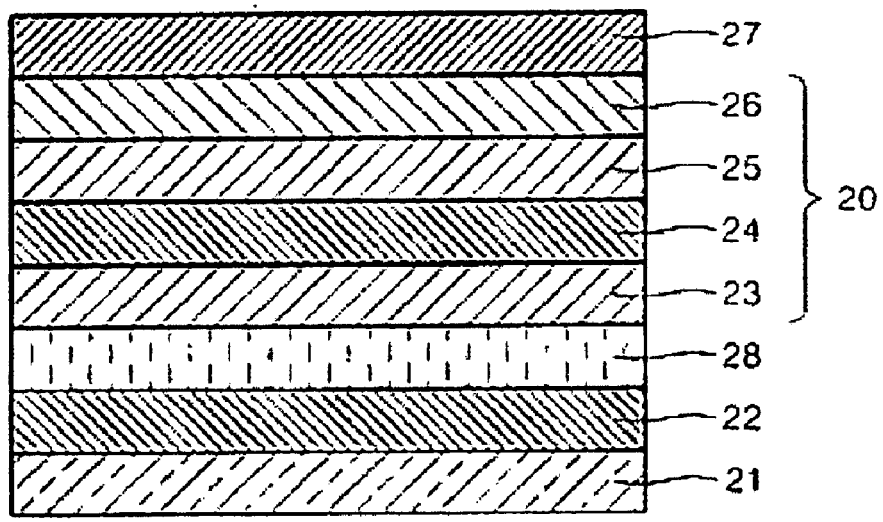
FIGS. 3A and 3B are cross-sectional views of examples of applying the magnetoresistance device of FIG. 2 to a GMR structure.
Figure 3B:
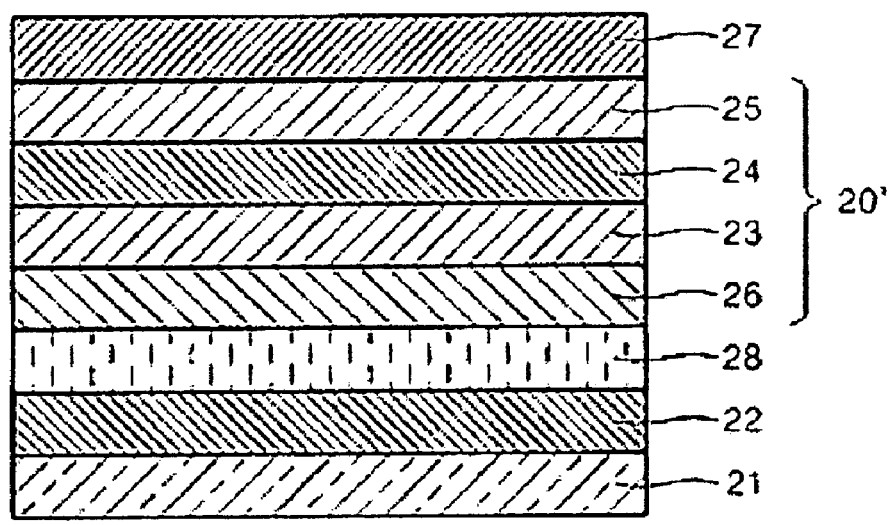

In an embodiment, the magnetoresistance device shown in FIG. 2 is applied to a GMR structure as shown in FIGS. 3A and 3B. FIGS. 3A and 3B illustrate a spin valve type magnetoresistance device, which is categorized into a top structure of FIG. 3A and a bottom structure of FIG. 3B according to the position of a semi-ferromagnetic layer.

Referring to FIG. 3A, the spin valve type magnetoresistance device having the top structure comprises a substrate 21, a lower layer 22 formed on the substrate 21 and a sensing portion 20' formed over the lower layer 22. The sensing portion 20' comprises a first ferromagnetic layer 23, a spacer layer 24, a second ferromagnetic layer 25, and a semi-ferromagnetic layer 26, which are sequentially stacked. Here, the magnetoresistance device may further comprise a buffer layer 28 between the lower layer 22 and the first ferromagnetic layer 23. Preferably, an upper layer 27 is further formed on the sensing portion 20'.

The substrate 21 can be formed of any material for forming a magnetoresistance device and is typically a silicon (Si) substrate. Also, the substrate 21 may be a Si wafer on which a $SiO_2$ layer is formed by oxidizing a top surface of the Si wafer. In the magnetoresistance device of the present invention, the lower layer 22 is formed of amorphous $Zr_xAl_{1-x}$ (0<x<1) or $Zr_xAl_{1-x}O_y$ (0<x<1, 0<y<1), which can improve an MR ratio of the magnetoresistance device more than when the lower layer 22 is formed of a magnetic material. Also, the upper layer 27 includes amorphous $Zr_xAl_{1-x}$ (0<x<1) or $Zr_xAl_{1-x}O_y$ (0<x<1, 0<y<1). Since other layers constituting the sensing portion 20' are described in detail in the "Background of the Invention", a description thereof will not be repeated here.

Referring to FIG. 3B, the spin valve type magnetoresistance device having the GMR bottom structure comprises a substrate 21, a lower layer 22 formed on the substrate 21, and a sensing portion 20' formed over the lower layer 22. The sensing portion 20' comprises a semi-ferromagnetic layer 26, a first ferromagnetic layer 23, a spacer layer 24, and a second ferromagnetic layer 25, which are sequentially stacked. The magnetoresistance device may further comprise a buffer layer 28 between the lower layer 22 and the semi-ferromagnetic layer 26. Preferably, an upper layer 27 is further formed on the sensing portion 20'.

The lower layer 22 is formed of amorphous $Zr_xAl_{1-x}$ (0<x<1) or $Zr_xAl_{1-x}O_y$ (0<x<1, 0<y<1), which can improve an MR ratio of the magnetoresistance device more than when the lower layer 22 is formed of a magnetic material. Also, the upper layer 27 contains amorphous $Zr_xAl_{1-x}$ (0<x<1) or $Zr_xAl_{1-x}O_y$ (0<x<1, 0<y<1).

Figure 4A:
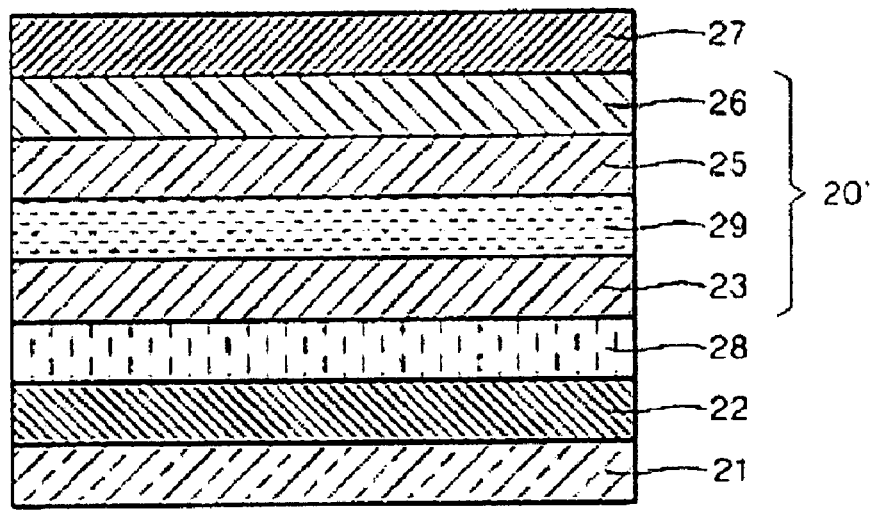
FIGS. 4A and 4B are cross-sectional views of examples of applying the magnetoresistance device of FIG. 2 to a TMR structure.
Figure 4B:
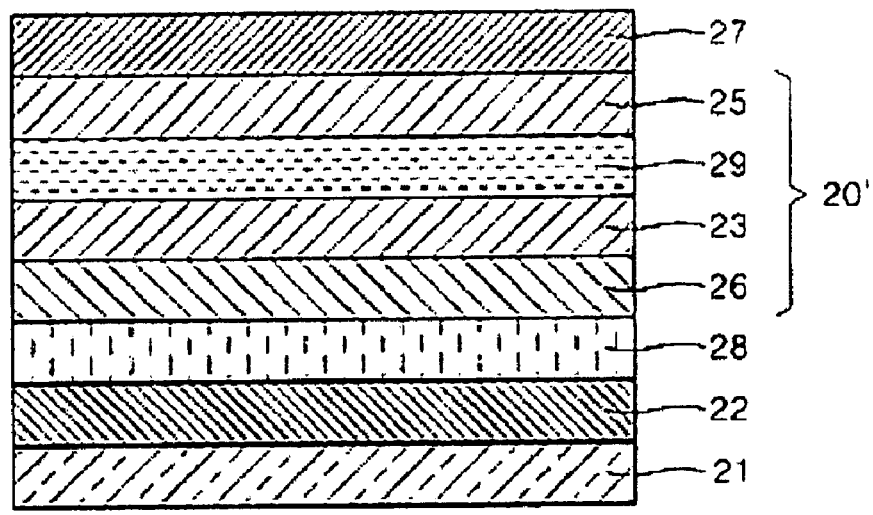

In another embodiment, the magnetoresistance device shown in FIG. 2 is applied to a TMR structure as shown in FIGS. 4A and 4B. FIGS. 4A and 4B illustrate a spin valve magnetoresistance device, which is categorized into a top structure of FIG. 4A and a bottom structure of FIG. 4B according to the position of a semi-ferromagnetic layer.

Referring to FIG. 4A, which illustrates the TMR top structure, a lower layer 22 is formed on a substrate 21, and a sensing portion 20' is formed over the lower layer 22. The sensing portion 20' comprises a first ferromagnetic layer 23, a tunneling barrier layer 29, a second ferromagnetic layer 25, and a semi-ferromagnetic layer 26, which are sequentially stacked. The magnetoresistance device may further comprise a buffer layer 28 between the lower layer 22 and the first ferromagnetic layer 23. Preferably, an upper layer 27 is further formed on the sensing portion 20'. The lower layer 22 contains amorphous $Zr_xAl_{1-x}$ (0<x<1). Preferably, the upper layer 27 also contains amorphous $Zr_xAl_{1-x}$ (0<x<1). The tunneling barrier layer 29 is formed of $(Zr, Ti, or Nb)_xAl_{1-x}O_y$ (0<x<1, 0<y<1). Since materials constituting the sensing portion 20' and layer 28 are described in detail in the Background of the Invention, a description thereof will not be repeated here.

Referring to FIG. 4B, which illustrates the TMR bottom structure, a lower layer 22 is formed on a substrate 21, and a sensing portion 20' is formed over the lower layer 22. The sensing portion 20' comprises a semi-ferromagnetic layer 26, a first ferromagnetic layer 21, a tunneling barrier layer 29, and a second ferromagnetic layer 25, which are sequentially stacked. The magnetoresistance device may further comprise a buffer layer 28 between the lower layer 22 and the semi-ferromagnetic layer 26. Preferably, an upper layer 27 is further formed on the sensing portion 20'. In the present invention, the lower layer 22 contains amorphous $Zr_xAl_{1-x}$ (0<x<1). Preferably, the upper layer 27 also contains amorphous $Zr_xAl_{1-x}$ (0<x<1). The tunneling barrier layer 29 is formed of $(Zr, Ti, or Nb)_xAl_{1-x}O_y$ (0<x<1, 0<y<1).

As described above, in the magnetoresistance device of the present invention, a lower layer 22 contains amorphous $Zr_xAl_{1-x}$ (0<x<1). Also, if the magnetoresistance device comprises an upper layer 27, the upper layer 27 also contains amorphous $Zr_xAl_{1-x}$ (0<x<1). In a TMR magnetoresistance device, a tunneling barrier layer 29 can be formed of $(Zr, Ti, or Nb)_xAl_{1-x}O_y$ (0<x<1, 0<y<1). That is, the tunneling barrier layer 29 is formed of at least one selected from the group consisting of $Zr_xAl_{1-x}O_y$ (0<x<1, 0<y<1), $Ti_xAl_{1-x}O_y$ (0<x<1, 0<y<1), and $Nb_xAl_{1-x}O_y$ (0<x<1, 0<y<1).

The above-described structure can be applied to not only a magnetoresistance head but also various magnetoresistance devices such as an MRAM.

A method of manufacturing a magnetoresistance device of the present invention will not be described in detail. As an example, the GMR structure shown in FIG. 3A can be formed using a magnetron sputtering process as follows. Initially, a substrate 21 is prepared. The substrate 21 can be a Si wafer on which an oxide layer is formed by oxidizing a top surface of the Si wafer. Thereafter, a lower layer 22 contains amorphous $Zr_xAl_{1-x}$ (0<x<1) or $Zr_xAl_{1-x}O_y$ (0<x<1, 0<y<1) on the substrate 21. If a buffer layer 28 is formed, the buffer layer 28 can be formed using Permalloy (NiFe) on the lower layer 22. Thereafter, a first ferromagnetic layer 23, a space layer 24, a second ferromagnetic layer 25, and a semi-ferromagnetic layer 26 are sequentially stacked on the resultant structure. An upper layer 27 may further contain amorphous $Zr_xAl_{1-x}$ (0<x<1) or $Zr_xAl_{1-x}O_y$ (0<x<1, 0<y<1) on the stack structure. When the first ferromagnetic layer 23 and the second ferromagnetic layer 25 are formed of CoFe, $Co_{90}Fe_{10}$ can be used as a target for deposition. The spacer layer 24 is deposited using Cu as a target, and the semi-ferromagnetic layer 26 is deposited using $Ir_{21}Mn_{79}$ as a target.

In the above-described method, a sensing portion 20' and the buffer layer 28 can be formed by using conventional methods. Each of the targets should have a degree of purity of 99.95% or higher, and Ar gas having a degree of purity of 99.9999% or higher should be used as sputtering gas. Preferably, an initial vacuum degree before deposition is $5 \times 10^{-8}$ Torr or less, a power for deposition is 50 to 130 W, and a magnetic field of 500 Oe is applied to anisotropy of the layers. The thickness of each layer can be controlled according to the environments under which a certain magnetoresistance device is manufactured. In particular, the thickness of each layer constituting the sensing portion 20' is in a typical range. Here, if the lower layer 22 or upper layer 27 is formed of $Zr_xAl_{1-x}O_y$ (0<x<1, 0<y<1), it is possible that amorphous $Zr_xAl_{1-x}$ (0<x<1) is formed and then oxidized in a reaction chamber including a sample, into which $O_2$ gas is injected, to obtain $Zr_xAl_{1-x}O_y$ (0<x<1, 0<y<1). The lower layer 22 or the upper layer 27, which is formed of amorphous $Zr_xAl_{1-x}$ (0<x<1) or $Zr_xAl_{1-x}O_y$ (0<x<1, 0<y<1), can be formed to various thicknesses ranging from several Å to several hundred nm according to the type of a magnetoresistance device.

Figure 4C:
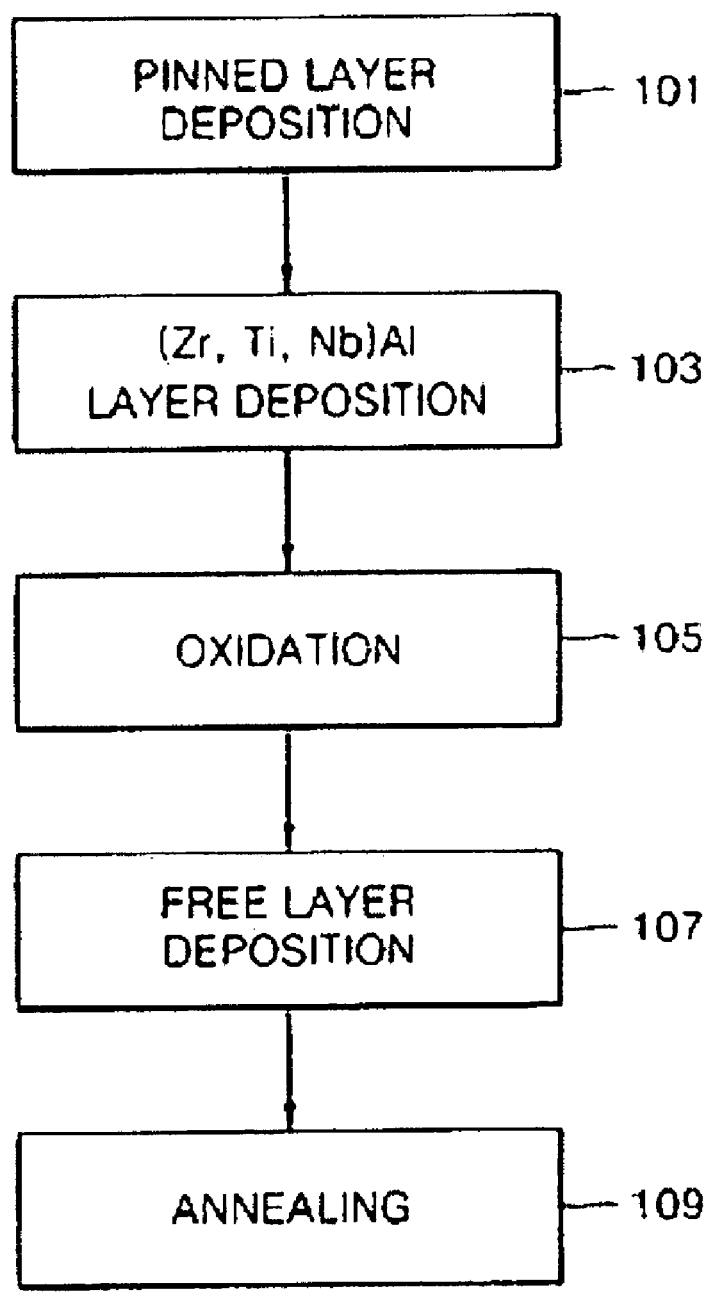
FIG. 4C is a flowchart illustrating a method of manufacturing a TMR device according to the present invention.

FIG. 4C is a flowchart illustrating a method of forming a TMR device, in which a tunneling barrier layer 29 is formed using $(Zr, Ti, or Nb)_xAl_{1-x}O_y$ (0<x<1, 0<y<1).

Referring to FIG. 4C, in step 101, a substrate is prepared, a semi-ferromagnetic layer is deposited on the substrate, and a fixed layer is deposited on the semi-ferromagnetic layer. Next, an Al target to which a Zr, Ti, or Nb chip is attached is prepared on the fixed layer, and an amorphous $Zr_xAl_{1-x}O_y$ (0<x<1, 0<y<1) layer, an amorphous $Ti_xAl_{1-x}O_y$ (0<x<1, 0<y<1) layer, or an amorphous $Nb_xAl_{1-x}O_y$ (0<x<1, 0<y<1) layer is deposited on the fixed layer using a sputtering apparatus in step 103. Here, the number of chips attached to the fixed layer can be controlled to adjust a composition of materials constituting the tunneling barrier layer 29.

Table 1 shows a Zr content with respect to the number of Zr chips in case of forming the tunneling barrier layer 29 using $Zr_xAl_{1-x}O_y$ (0<x<1, 0<y<1). It is possible to adjust the Zr content in the amorphous $Zr_xAl_{1-x}$(0<x<1) layer by controlling the number of the Zr chips.

TABLE 1

| | Number of chips | | | | | | | | |
|---|---|---|---|---|---|---|---|---|---|
| | 3 | 4 | 5 | 6 | 7 | 8 | 9 | 10 | 11 | 12 |
| Zr content | 3.15 | 4.02 | 4.77 | 5.41 | 6.24 | 7.22 | 8.51 | 9.89 | 10.39 | 11.56 |

To form a amorphous $Zr_xAl_{1-x}$ (0<x<1) layer with a Zr content of 8 at. % to 12 at. %, 8 to 12 chips are prepared. To allow a Zr content of 9 at. % to 11.5 at. %, 9 to 11 chips are disposed. Also, to fit the Zr content to 9.89 at. %, 10 chips are mounted and then sputtered.

After sputtering, the amorphous $Zr_xAl_{1-x}$ (0<x<1) is oxidized using $O_2$ treatment as shown in step 105, and then a free layer is deposited in step 107. After the free layer is deposited, the resultant structure is annealed at a predetermined temperature of, preferably, about 200° C. to 500° C. in step 109. Here, the free layer, the amorphous $Zr_xAl_{1-x}$ (0<x<1) barrier layer, and the fixed layer are deposited using magnetron sputtering. Detailed experimental conditions for forming a $(Zr, Ti, or Nb)_xAl_{1-x}O_y$ (0<x<1, 0<y<1) barrier layer will now be described.

Sample magnetic tunnel junctions (MTJs), where $Zr_xAl_{1-x}O_y$ (0<x<1, 0<y<1) barrier layers are to be formed later, were formed using 4-gun radio frequency (RF) magnetron sputtering. In each case, a Si wafer 100 including a thermal oxide layer with a diameter of 200 nm was used. During the formation of the sample MTJs, an initial vacuum degree was maintained at about $5 \times 10^{-7}$ Torr or less. Each of the sample MTJs had a structure of $SiO_2$/Ta(5 nm)/CoFe(17 nm)/IrMn (7.5 nm)/CoFe(5 nm)/$Zr_xAl_{1-x}$(0.5 to 1.8 nm)$O_y$/CoFe(5 nm)/Ta(5 nm) and was formed to be cruciform using three different kinds of metal shadow masks. Here, the area of each sample MTJ was set to 100×100 $\mu m^2$.

To form a $Zr_xAl_{1-x}O_y$ (0<x<1, 0<y<1) barrier layer, an amorphous $Zr_xAl_{1-x}$ (0<x<1) layer was deposited to a thickness of 0.5 to 1.8 nm and then exposed to $O_2$ gas. The sample MTJs were annealed under a pressure of about $3 \times 10^{-6}$ Torr for a fixed duration of time, i.e., for 10 minutes each but at different temperatures of 250° C. to 450° C. The $Ti_xAl_{1-x}O_y$ (0<x<1, 0<y<1) barrier layer or $Nb_xAl_{1-x}O_y$ (0<x<1, 0<y<1) barrier formed in the same manner as the $Zr_xAl_{1-x}O_y$ (0<x<1, 0<y<1) barrier layer.

The magnetoresistance devices as described with reference to FIGS. 3B, 4A, and 4B can be easily manufactured by adding formation of the lower layer 22 or the upper layer 27 using amorphous $Zr_xAl_{1-x}$ (0<x<1) or $Zr_xAl_{1-x}O_y$ (0<x<1, 0<y <1) to the conventional method of manufacturing a magnetoresistance head. Also, to form a TMR device, formation of a tunneling barrier layer using $(Zr, Ti, or Nb)_xAl_{1-x}O_y$ (0<x<1, 0<y<1) is further performed.

In the magnetoresistance device of the present invention, the lower layer 22 is very stable even at a high temperature of about 500° C., and several layers constituting the sensing portion 20' formed on the lower layer 22 are fine and dense. This is because the lower layer 22 formed using amorphous $Zr_xAl_{1-x}$ (0<x<1) or $Zr_xAl_{1-x}O_y$ (0<x<1, 0<y<1) has a flat surface as compared with the lower layer 12 of the conventional magnetoresistance device.

Tables 2A and 2B each show a comparison of surface roughness (i.e., a difference between a highest surface an a lowest surface) of the conventional magnetoresistance device using the Ta lower layer 12 and the magnetoresistance device of the present invention. The magnetoresistance device of the present invention uses the lower layer 22 formed of, for example, $Zr_xAl_{1-x}$ (0<x<1), and the sensing unit 20' is formed on the lower layer 22. Table 2A is obtained based on a magnetoresistance device of the present invention having the GMR top structure shown in FIG. 3A, and Table 2B is obtained based on a magnetoresistance device of the present invention having the TMR bottom structure shown in FIG. 4B. The surface roughness was measured for respective layers stacked on a substrate.

In Table 2A, a first sample is a conventional magnetoresistance device using a Ta lower layer 12 and a Ta upper layer 17, and a second sample is a magnetoresistance device of the present invention using a amorphous $Zr_xAl_{1-x}$ (0<x<1) lower layer 22 and a amorphous $Zr_xAl_{1-x}$ (0<x<1) upper layer 27. The first and second samples each have a structure of a substrate/lower layer/buffer layer/first ferromagnetic layer/spacer layer/second ferromagnetic layer/semi-ferromagnetic layer/upper layer. Specifically, the first sample includes $Si(SiO_2)$/Ta/NiFe/CoFe/Cu/CoFe/IrMn/Ta, and the second sample includes $Si(SiO_2)$/$Zr_xAl_{1-x}$(0<x<1)/ NiFe/CoFe/Cu/CoFe/IrMn/$Zr_xAl_{1-x}$ (0<x<1). The NiFe layer is 2 nm, the first CoFe layer is 3 nm, the Cu layer is 2.5 nm, the second CoFe layer is 3 nm, and the IrMn layer is 7.5 nm. The Ta layer of the first sample is 5 nm, and the amorphous $Zr_xAl_{1-x}$(0<x<1) layer of the second sample is 2 nm.

TABLE 2A

| | Lower | Buffer | 1st ferromagnetic | Spacer | 2nd ferromagnetic | Anti-ferromagnetic | Upper |
|---|---|---|---|---|---|---|---|
| 1st sample | 0.412 | 0.311 | 0.272 | 0.266 | 0.247 | 0.234 | 0.242 |
| 2nd sample | 0.165 | 0.228 | 0.205 | 0.210 | 0.194 | 0.178 | 0.172 |

As shown in Table 2A, in the magnetoresistance device of the present invention using the lower layer 22 formed of amorphous $Zr_xAl_{1-x}$ (0<x<1), the lower layer 22 and the upper layers stacked thereon each have a lower surface roughness and a higher surface flatness than in the conventional magnetoresistance device. Since the surface flatness of upper layers depends on the surface flatness of lower layers, a high surface flatness of the lower layer 22 formed of amorphous $Zr_xAl_{1-x}$ (0<x<1) has a good effect on the surface flatness of each layer constituting the sensing unit 20'.

In Table 2B, a first sample is a conventional magnetoresistance device using a Ta lower layer 12 and a Ta upper layer 17, and a second sample is a magnetoresistance device of the present invention using a lower layer 22 and an upper layer 27, each of which is formed of amorphous $Zr_xAl_{1-x}$ (0<x<1). The first and second samples each have a structure of a substrate/lower layer/buffer layer/semi-ferromagnetic layer/first ferromagnetic layer/tunneling barrier layer/ second ferromagnetic layer/upper layer. Specifically, the first sample includes $Si(SiO_2)$/Ta/NiFe/IrMn/CoFe/$ZrAlO_x$/ CoFe/Ta, and the second sample includes $Si(SiO_2)$/$Zr_xAl_{1-}$ $_x$(0<x<1)/NiFe/IrMn/CoFe/ZrAlO$_x$/CoFe/Zr$_x$Al$_{1-x}$(0<x<1). The NiFe layer is 2 nm, the IrMn layer is 7.5 nm, the first CoFe layer is 3 nm, the ZrAlO$_x$ layer is 1.6 nm, and the second CoFe layer is 3 nm. The Ta layer of the first sample is 5 nm, and the amorphous Zr$_x$Al$_{1-x}$(0<x<1) layer of the second sample is 2 nm.

TABLE 2B

| | Lower | Buffer | Antiferromagnetic | 1$^{st}$ ferromagnetic | Tunnel barrier | 2$^{nd}$ ferromagnetic | Upper |
|---|---|---|---|---|---|---|---|
| 1$^{st}$ sample | 0.418 | 0.315 | 0.294 | 0.272 | 0.161 | 0.157 | 0.155 |
| 2$^{nd}$ sample | 0.167 | 0.231 | 0.222 | 0.209 | 0.138 | 0.133 | 0.129 |

As shown in Table 2B, in the magnetoresistance device of the present invention using the lower layer 22 formed of amorphous Zr$_x$Al$_{1-x}$ (0<x<1), the lower layer 22 and the upper layers stacked thereon each have a lower surface roughness and a higher surface flatness than in the conventional magnetoresistance device.

Figure 5A:
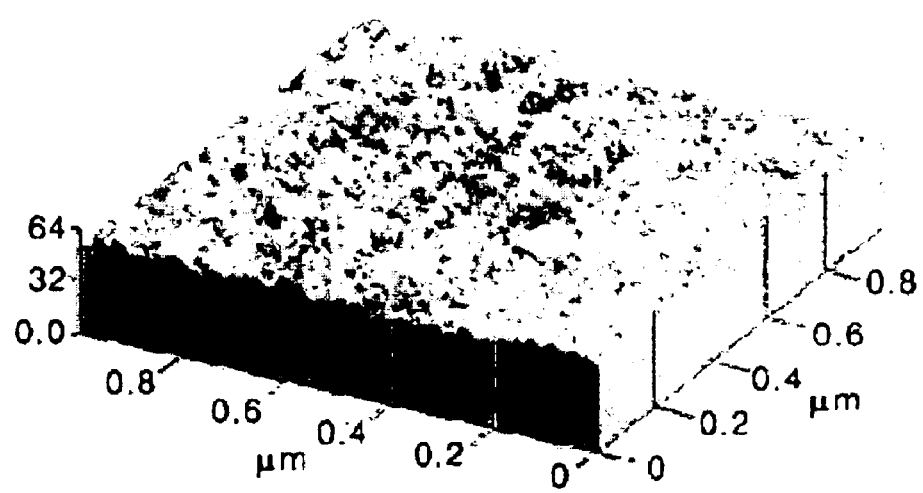
FIG. 5A is an atomic force microscopy (AFM) image illustrating a lower layer formed of Ta in a conventional magnetoresistance device.
Figure 5B:
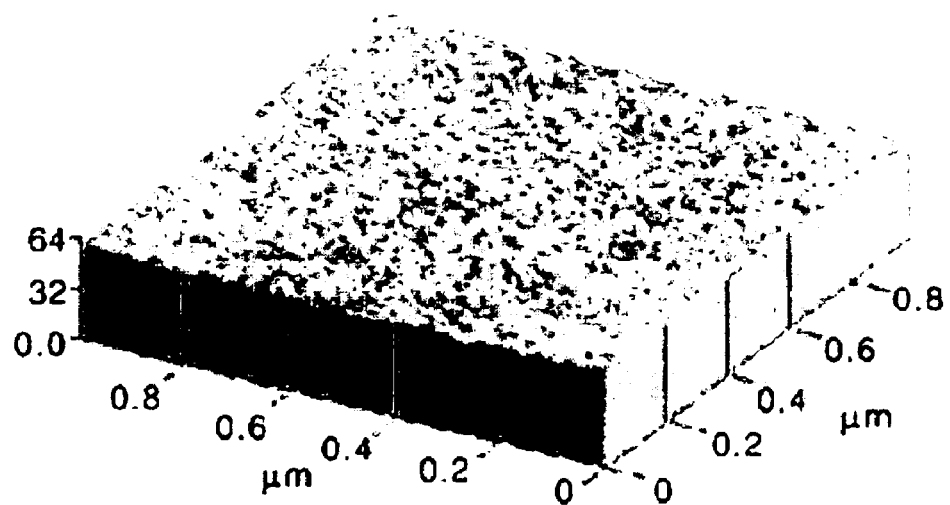
FIG. 5B is an AFM image illustrating a lower layer formed of amorphous $Zr_xAl_{1-x}$ (0<x<1) according to the present invention.

FIGS. 5A and 5B graphically illustrate a comparison of surface roughness between lower layers of the conventional magnetoresistance device and the magnetoresistance device of the present invention. FIG. 5A is an AFM image illustrating a Ta lower layer 12 of the conventional magnetoresistance device, and FIG. 5B is an AFM image illustrating a lower layer 22 formed of amorphous Zr$_x$Al$_{1-x}$ (0<x<1) according to the present invention. The lower layer 22 is formed on a substrate 21 in a GMR top structure forming process. The surface roughness of the Ta lower layer 12 is 0.43 nm as shown in FIG. 5A, while the surface roughness of the lower layer 22 formed of amorphous Zr$_x$Al$_{1-x}$(0<x<1) is 0.16 nm as shown in FIG. 5B. Thus, the lower layer 22 of the present invention has a surface flatness higher than the conventional Ta lower layer 12.

Various annealing experiments were performed on the above-described samples as follows.

Figure 6A:
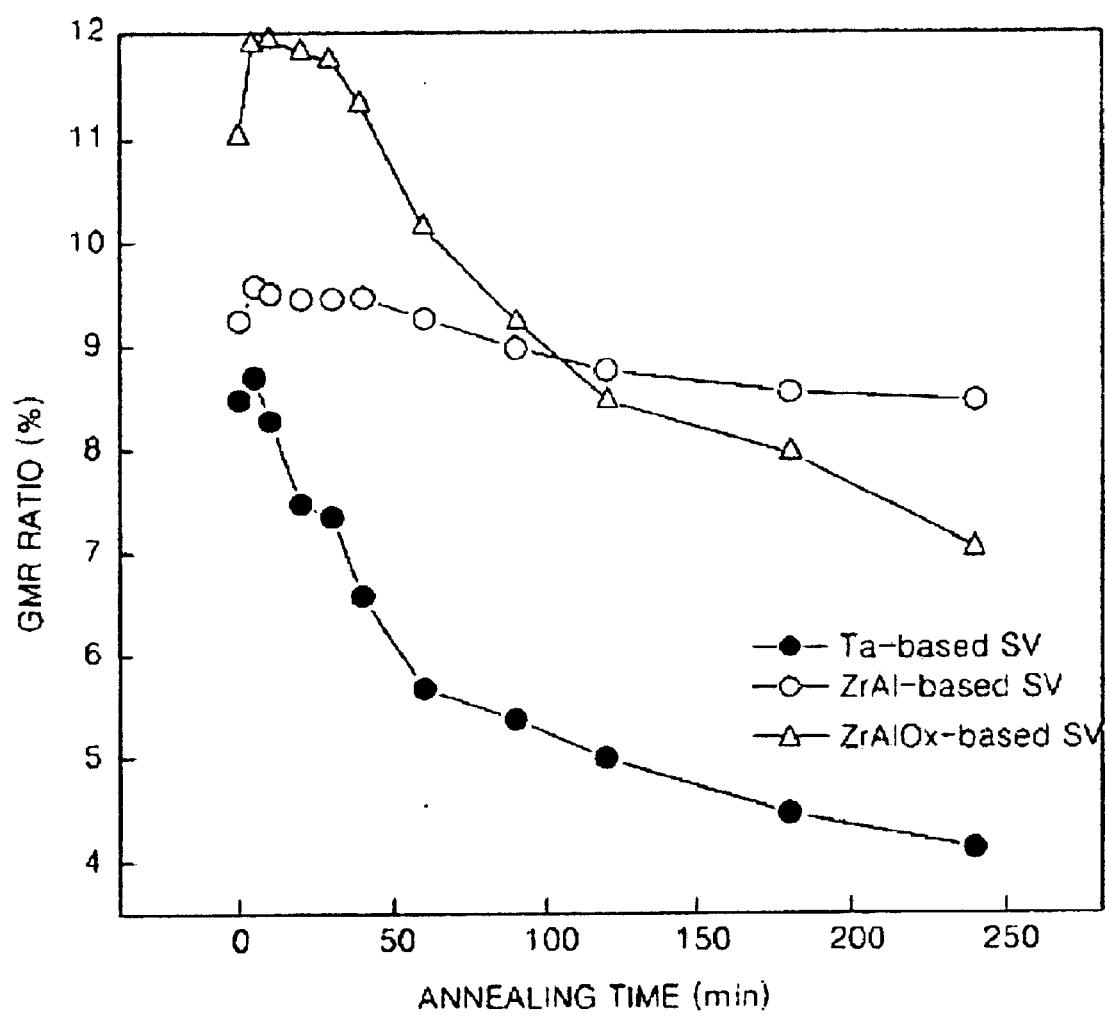
FIG. 6A is a graph showing the GMR ratio versus the annealing time of each of the conventional magnetoresistance device including a lower layer formed of Ta and magnetoresistance devices including lower layers formed of amorphous $Zr_xAl_{1-x}$ (0<x<1) and $Zr_xAl_{1-x}O_y$ (0<x<1, 0<y<1), respectively, according to the present invention.

The samples shown in Table 2A were annealed at a temperature of about 300° C. for different amounts of time, and the GMR ratio was measured for each sample. FIG. 6A is a graph showing the MR ratio versus the annealing time of each of the samples. Referring to FIG, 6A, in the first sample shown in Table 2A, which is the conventional magnetoresistance device using the Ta lower layer 12 and the Ta upper layer 17, a GMR ratio decreased from 8.49% to 4.13% in an annealing time of about 250 min. However, in the second sample shown in Table 2A, which is the magnetoresistance device using the lower layer 22 and the upper layer 27, each of which is formed of amorphous Zr$_x$Al$_{1-x}$ (0<x<1), a GMR ratio hardly decreased for the same time. Also, in the case of a magnetoresistance device using a lower layer and an upper layer, each of which is formed of Zr$_x$Al$_{1-x}$O$_y$ (0<x<1, 0<y<1), although a GMR ratio decreased more than that of the second sample, a GMR ratio was considerably high until about 100 min. elapsed.

Figure 6B:
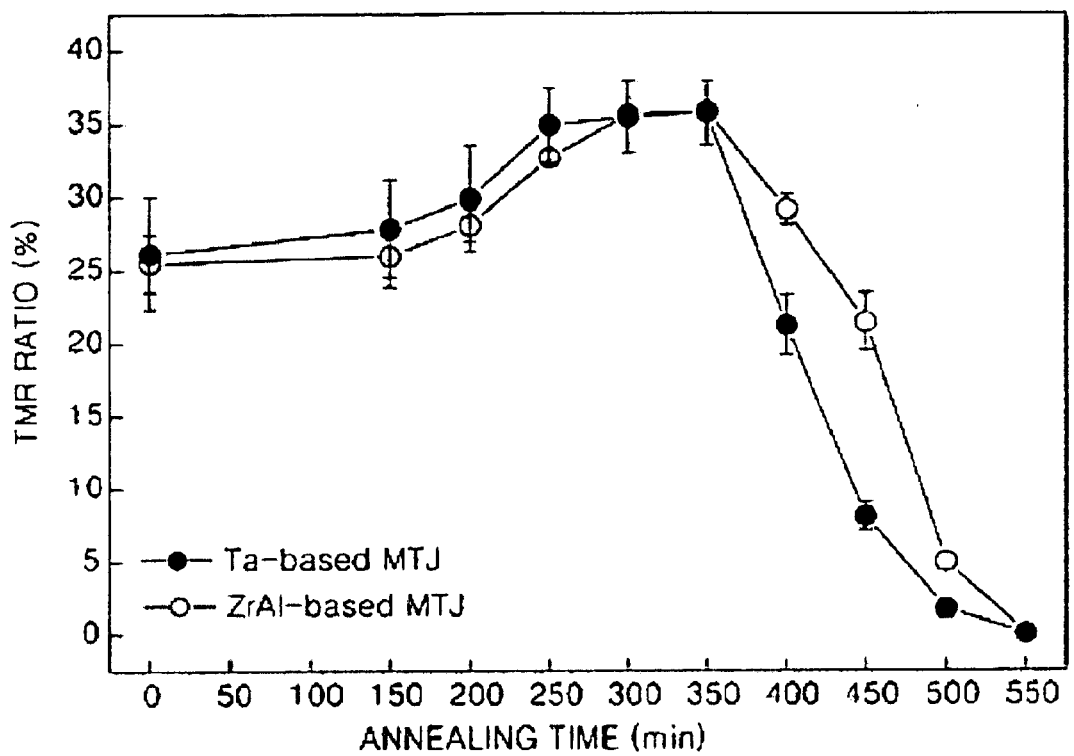
FIG. 6B is a graph showing the TMR ratio versus the annealing temperature of each of the conventional magnetoresistance device including the lower layer formed of Ta and the magnetoresistance device including the lower layer formed of amorphous $Zr_xAl_{1-x}$ (0<x<1) according to the present invention.

The samples shown in Table 2B were annealed at different temperatures, and then the TMR ratio was measured for each sample. FIG. 6B is a graph showing the TMR ratio versus the annealing temperature of each of the samples. Referring to FIG. 6B, in the first sample, which is the conventional magnetoresistance device using the Ta lower layer 12 and the Ta upper layer 17, a TMR ratio dramatically decreased at a temperature of about 350° C. or higher. However, in the second sample, which is the magnetoresistance device of the present invention, the TMR ratio decreased at a temperature of about 350° C. or higher, but not as dramatically as for the first sample. The second sample maintained a high TMR ratio of about 20% or more even at a temperature of about 450° C.

Figure 6C:
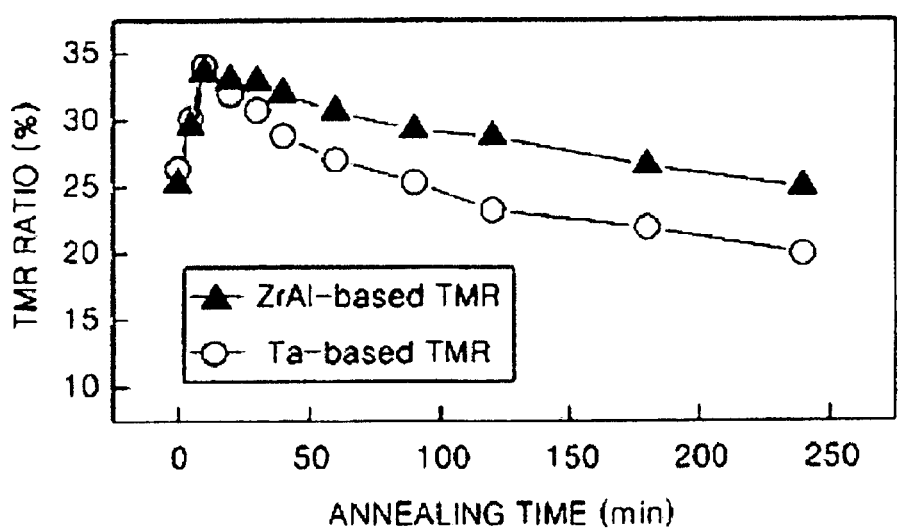
FIG. 6C is a graph showing the TMR ratio versus the annealing time of each of the conventional magnetoresistance device including the lower layer formed of Ta and the magnetoresistance device including the lower layer formed of amorphous $Zr_xAl_{1-x}$ (0<x<1) according to the present invention.

The samples shown in Table 2B were annealed at a temperature of about 300° C. for different amounts of time, and the TMR ratio was measured for each sample. FIG. 6C is a graph showing the TMR ratio versus the annealing time of each of the samples. Referring to FIG. 6C, a TMR ratio of the first sample was similar to that of the second sample for an initial annealing time of about 10-20 min. However, as an annealing time increased, a TMR ratio of the first sample became higher and more stable than that of the second sample.

As described above, the MR ratio of the conventional magnetoresistance device greatly decreased as the annealing temperature or time increased. This is because interdiffusion or intermixing of atoms occurred between adjacent layers in the conventional device. In particular, Mn elements of the semi-ferromagnetic layer diffused to the second ferromagnetic layer, thus deteriorating magnetic characteristics of an interface between the semi-ferromagnetic layer and the second ferromagnetic layer. Thus, when the lower layer and the upper layer are formed of amorphous Zr$_x$Al$_{1-x}$ (0<x<1) or Zr$_x$Al$_{1-x}$O$_y$ (0<x<1, 0<y<1), the magnetoresistance device ensures excellent thermal stability as compared with the conventional device.

As described above, in the magnetoresistance device of the present embodiment, the first ferromagnetic layer 23 and the second ferromagnetic layer 25 are formed of a CoFe alloy, the spacer layer 24 is formed of Cu, and the semi-ferromagnetic layer 26 is formed of an IrMn alloy. However, the first ferromagnetic layer 23, the spacer layer 24, the second ferromagnetic layer 25, and the semi-ferromagnetic layer 26 can be formed of other known materials.

Also, the amorphous Zr$_x$Al$_{1-x}$ (0<x<1) or Zr$_x$Al$_{1-x}$O$_y$ (0<x<1, 0<y<1) can be used to form not only a lower layer of the magnetoresistance device but also a lower layer of various types of devices. That is, it is possible to form a device including a multi-layered structure having excellent characteristics by using amorphous Zr$_x$Al$_{1-x}$ (0<x<1) or Zr$_x$Al$_{1-x}$O$_y$ (0<x<1, 0<y<1) as a lower layer disposed between a substrate and the multi-layered structure. As described above, when a lower layer formed of amorphous Zr$_x$Al$_{1-x}$ (0<x<1) or Zr$_x$Al$_{1-x}$O$_y$ (0<x<1, 0<y<1) is formed on a Si wafer, it exhibits a high surface flatness. Also, since the multi-layered structure formed on the lower layer is affected by the lower layer, each layer constituting the multi-layered structure can have a high surface flatness. Further, various stable structure can be formed by using amorphous Zr$_x$Al$_{1-x}$ (0<x<1) as an upper layer.

Also, in the magnetoresistance device of the present invention, since the tunneling barrier layer 29 contains Zr, Ti, or Nb in a predetermined ratio (%), the magnetoresistance device has a low roughness, a uniform thickness, few defects, and a high MR ratio. These characteristics of the tunneling barrier layer 29 will now be described with reference to FIGS. 7A, 7B, 8A, and 8B.

Figure 7A:
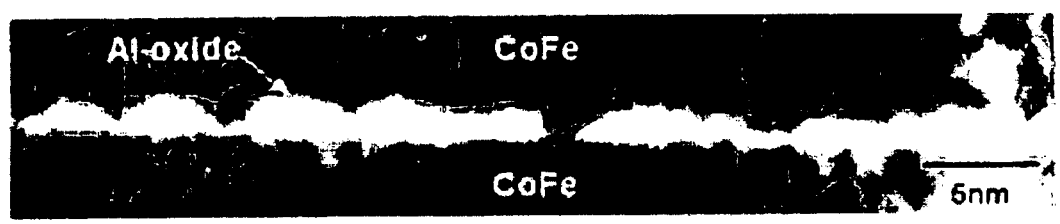
FIG. 7A is a transmission electron microscopes (TEM) photograph of a conventional magnetoresistance device with an $AlO_x$ barrier layer interposed between CoFe layers.
Figure 7B:
FIG. 7B is a TEM photograph of a magnetoresistance device according to the present invention, in which an $AlO_x$ barrier layer doped with a Zr content of about 10 at. % is interposed between CoFe layers.

FIG. 7A is a TEM photograph of a conventional magnetoresistance device with an AlO$_x$ barrier layer interposed between CoFe layers, and FIG. 7B is a TEM photograph of a magnetoresistance device according to the present invention, in which an AlO$_x$ barrier layer doped with a Zr content of about 10 at. % is interposed between CoFe layers.

Referring to FIG. 7A, pinholes were formed in a surface of the AlO$_x$ barrier layer, and CoFe elements diffused into the $AlO_x$ barrier layer. Thus, the uniformity of the $AlO_x$ barrier layer was degraded. However, referring to FIG. 7B, CoFe elements did not diffuse into the $AlO_x$ barrier layer doped with a Zr content of about 10 at. %. The AlOx barrier layer of FIG. 7B has a uniform surface without pinholes, defects, or disorders.

Figure 8A:
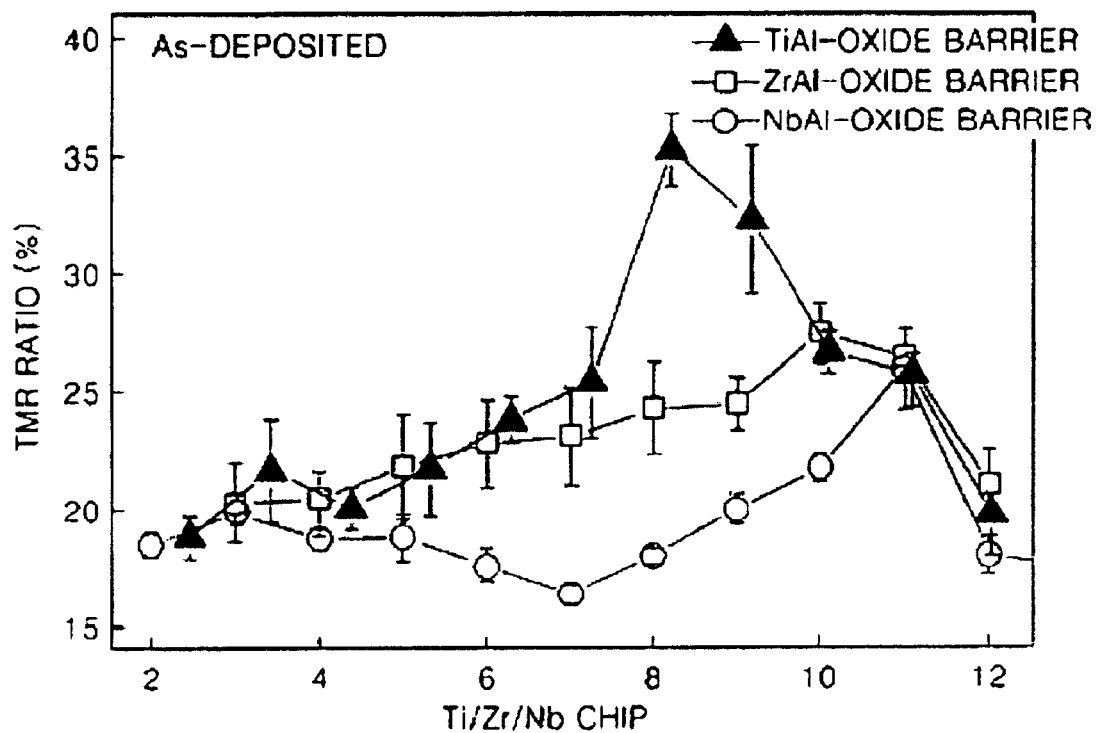
FIG. 8A is a graph showing a TMR ratio of a TMR device formed by adjusting a composition thereof before an annealing process.
Figure 8B:
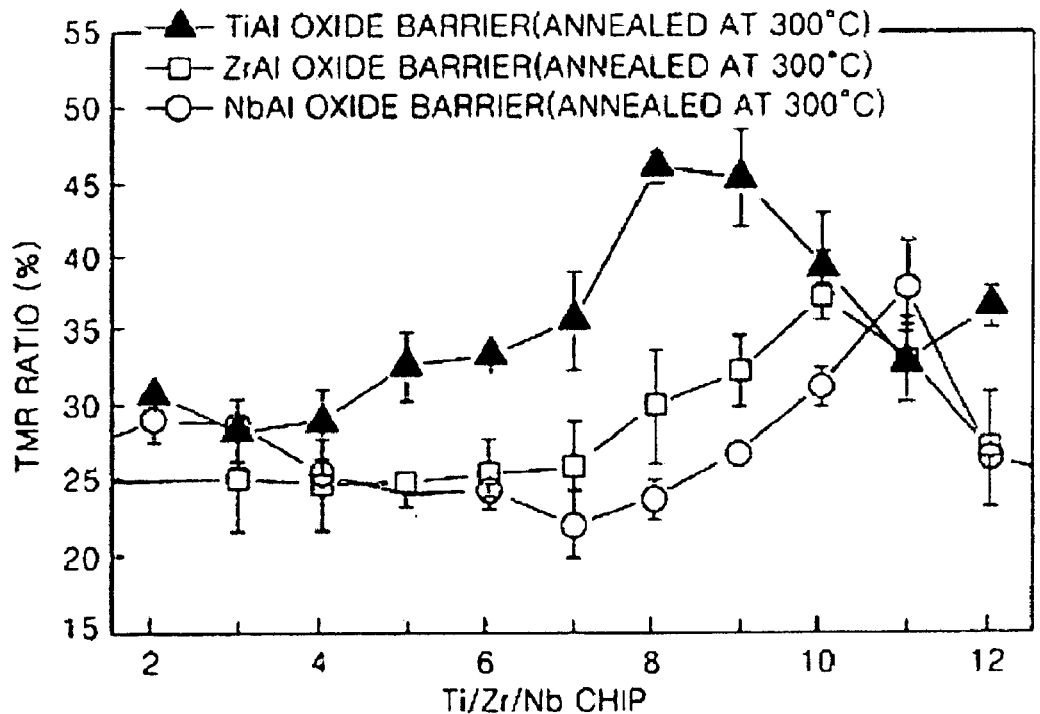
FIG. 8B is a graph showing a TMR ratio of a TMR device formed by adjusting a composition thereof after the annealing process.

FIG. 8A is a graph showing a TMR ratio of a TMR device formed by adjusting a composition thereof before an annealing process, and FIG. 8B is a graph showing a TMR ratio of a TMR device formed by adjusting a composition thereof after the annealing process. In FIGS. 8A and 8B, samples each have a structure of Ta (5 nm)/CoFe (17 nm)/IrMn (7.5 nm)/CoFe (3 nm)/(Zr, Nb, or Ti)$_x$Al1-xOy (1.6 nm)/CoFe (3 nm)/Ta (5 nm). FIG. 8B shows the results obtained by annealing the samples shown in FIG. 8A. $Ti_xAl_{1-x}O_y$ (0<x<1, 0<y<1) was annealed at a temperature of about 300° C., and $Zr_xAl_{1-x}O_y$ (0<x<1, 0<y<1) and $Nb_xAl_{1-x}O_y$ (0<x<1, 0<y<1) were annealed at a temperature of about 250° C. Here, a composition of Zr, Ti, or Nb can be easily controlled according to the size and number of chips by measuring the deposition rate. Here, a composition of Ti increased to about 0.69 at. % per chip, and a composition of Nb increased to about 0.9 at. % per chip.

Referring to FIG. 8A, before the annealing process, a TMR ratio of $Ti_xAl_{1-x}O_y$ (0<x<1, 0<y<1) was highest and ranged from 18% to 35%. The $Ti_xAl_{1-x}O_y$ (0<x<1, 0<y<1), $Zr_xAl_{1-x}O_y$ (0<x<1, 0<y<1), and $Nb_xAl_{1-x}O_y$ (0<x<1, 0<y<1) each have an improved MR ratio as compared with the conventional magnetoresistance device. Referring to FIG. 8B, which shows the results obtained after an annealing process was performed at a temperature of about 250° C. to 300° C. for 10 min., the TMR ratio greatly increased. In the case of $Ti_xAl_{1-x}O_y$ (0<x<1, 0<y<1), a TMR ratio increased and ranged from 28% to 47%. Thus, the magnetoresistance device of the present invention comprises a (Zr, Nb, or Ti)$_x$Al$_{1-x}$O$_y$ barrier layer and can have a high MR characteristic.

While the present invention has been particularly shown and described with reference to preferred embodiments thereof, it will be understood by those of ordinary skill in the art that various changes in form and details may be made therein without departing from the spirit and scope of the present invention as defined by the following claims.

As described above, the magnetoresistance device of the present invention comprises an upper layer and a lower layer, each of which has a uniform thickness, a low roughness, and few defects. Also, in the case of a TMR device, MR characteristics and thermal stability are improved by adjusting a composition of a tunneling barrier layer.

What is claimed is:

1. A magnetoresistance device comprising a substrate, a lower layer formed on the substrate, and a magnetoresistance structure formed on the lower layer,
   wherein the lower layer is formed of amorphous $Zr_xAl_{1-x}$ (0<x<1) or $Zr_xAl_{1-x}O_y$ (0<x<1, 0<y<1).

2. The device of claim 1, further comprising an upper layer formed on the magnetoresistance structure, the upper layer formed of amorphous $Zr_xAl_{1-x}$ (0<x<1) or $Zr_xAl_{1-x}O_y$ (0<x<1, 0<y<1).

3. The device of claim 1, wherein the magnetoresistance structure comprises:
   a first ferromagnetic layer of which magnetization direction is varied by an applied magnetic field;
   a spacer layer formed on the first ferromagnetic layer, the spacer layer formed of an nonmagnetic material;
   a second ferromagnetic layer formed on the spacer layer, the second ferromagnetic layer of which magnetization direction is fixed; and
   a anti-ferromagnetic layer formed on the second ferromagnetic layer, the anti-ferromagnetic layer for fixing the magnetization direction of the second ferromagnetic layer.

4. The device of claim 2, wherein the magnetoresistance structure comprises:
   a first ferromagnetic layer of which magnetization direction is varied by an applied magnetic field;
   a spacer layer formed on the first ferromagnetic layer, the spacer layer formed of an nonmagnetic material;
   a second ferromagnetic layer formed on the spacer layer, the second ferromagnetic layer of which magnetization direction is fixed; and
   a anti-ferromagnetic layer formed on the second ferromagnetic layer, the anti-ferromagnetic layer for fixing the magnetization direction of the second ferromagnetic layer.

5. The device of claim 1, wherein the magnetoresistance structure comprises:
   a anti-ferromagnetic layer;
   a first ferromagnetic layer formed on the anti-ferromagnetic layer, the first ferromagnetic layer of which magnetization direction is fixed by the anti-ferromagnetic layer;
   a spacer layer formed on the first ferromagnetic layer, the spacer layer formed of an nonmagnetic material; and
   a second ferromagnetic layer formed on the spacer layer, the second ferromagnetic layer of which magnetization direction is varied by an applied magnetic field.

6. The device of claim 2, wherein the magnetoresistance structure comprises:
   a anti-ferromagnetic layer;
   a first ferromagnetic layer formed on the anti-ferromagnetic layer, the first ferromagnetic layer of which magnetization direction is fixed by the anti-ferromagnetic layer;
   a spacer layer formed on the first ferromagnetic layer, the spacer layer formed of an nonmagnetic material; and
   a second ferromagnetic layer formed on the spacer layer, the second ferromagnetic layer of which magnetization direction is varied by an applied magnetic field.

7. The device of claim 1, wherein the magnetoresistance structure comprises:
   a first ferromagnetic layer of which magnetization direction is varied by an applied magnetic field;
   a tunneling barrier layer formed on the first ferromagnetic layer;
   a second ferromagnetic layer formed on the tunneling barrier layer, the second ferromagnetic layer of which magnetization direction is fixed; and
   a anti-ferromagnetic layer formed on the second ferromagnetic layer, the anti-ferromagnetic layer for fixing the magnetization direction of the second ferromagnetic layer.

8. The device of claim 2, wherein the magnetoresistance structure comprises:
   a first ferromagnetic layer of which magnetization direction is varied by an applied magnetic field;
   a tunneling barrier layer formed on the first ferromagnetic layer;
   a second ferromagnetic layer formed on the tunneling barrier layer, the second ferromagnetic layer of which magnetization direction is fixed; and a anti-ferromagnetic layer formed on the second ferromagnetic layer, the anti-ferromagnetic layer for fixing the magnetization direction of the second ferromagnetic layer.

9. The device of claim 1, wherein the magnetoresistance structure comprises:

a anti-ferromagnetic layer;

a first ferromagnetic layer formed on the anti-ferromagnetic layer, the first ferromagnetic layer of which magnetization direction is fixed by the anti-ferromagnetic layer;

a tunneling barrier layer formed on the first ferromagnetic layer; and a second ferromagnetic layer formed on the tunneling barrier layer, the second ferromagnetic layer of which magnetization direction is varied by an applied magnetic field.

10. The device of claim 2, wherein the magnetoresistance structure comprises:

a anti-ferromagnetic layer;

a first ferromagnetic layer formed on the anti-ferromagnetic layer, the first ferromagnetic layer of which magnetization direction is fixed by the anti-ferromagnetic layer;

a tunneling barrier layer formed on the first ferromagnetic layer; and a second ferromagnetic layer formed on the tunneling barrier layer, the second ferromagnetic layer of which magnetization direction is varied by an applied magnetic field.

11. A magnetoresistance device comprising a substrate, a magnetoresistance structure formed on the substrate, and an upper layer formed on the magnetoresistance structure, wherein the upper layer is formed of amorphous $Zr_xAl_{1-x}$ ($0<x<1$) or $Zr_xAl_{1-x}O_y$ ($0<x<1$, $0<y<1$).

12. The device of claim 11, wherein the magnetoresistance structure comprises:

a first ferromagnetic layer of which magnetization direction is varied by an applied magnetic field;

a spacer layer formed on the first ferromagnetic layer, the spacer layer formed of an nonmagnetic material;

a second ferromagnetic layer formed on the spacer layer, the second ferromagnetic layer of which magnetization direction is fixed; and a anti-ferromagnetic layer formed on the second ferromagnetic layer, the anti-ferromagnetic layer for fixing the magnetization direction of the second ferromagnetic layer.

13. The device of claim 11, wherein the magnetoresistance structure comprises:

a anti-ferromagnetic layer;

a first ferromagnetic layer formed on the anti-ferromagnetic layer, the first ferromagnetic layer of which magnetization direction is fixed by the anti-ferromagnetic layer;

a spacer layer formed on the first ferromagnetic layer, the spacer layer formed of an nonmagnetic material; and a second ferromagnetic layer formed on the spacer layer, the second ferromagnetic layer of which magnetization direction is varied by an applied magnetic field.

14. The device of claim 11, wherein the magnetoresistance structure comprises:

a first ferromagnetic layer of which magnetization direction is varied by an applied magnetic field;

a tunneling barrier layer formed on the first ferromagnetic layer;

a second ferromagnetic layer formed on the tunneling barrier layer, the second ferromagnetic layer of which magnetization direction is fixed; and a anti-ferromagnetic layer formed on the second ferromagnetic layer, the anti-ferromagnetic layer for fixing the magnetization direction of the second ferromagnetic layer.

15. The device of claim 11, wherein the magnetoresistance structure comprises:

a anti-ferromagnetic layer;

a first ferromagnetic layer formed on the anti-ferromagnetic layer, the first ferromagnetic layer of which magnetization direction is fixed by the anti-ferromagnetic layer;

a tunneling barrier layer formed on the first ferromagnetic layer; and a second ferromagnetic layer formed on the tunneling barrier layer, the second ferromagnetic layer of which magnetization direction is varied by an applied magnetic field.

16. A magnetoresistance device comprising a magnetoresistance structure formed of a fixed layer of which magnetization direction is fixed by a anti-ferromagnetic layer, a free layer of which magnetization direction is varied, and a tunneling barrier layer formed between the fixed layer and the free layer, wherein the tunneling barrier layer is formed of at least one selected from the group consisting of $Ti_xAl_{1-x}O_y$ ($0<x<1$, $0<y<1$), and $Nb_xAl_{1-x}O_y$($0<x<1$, $0<y<1$).

17. The device of claim 16, wherein the magnetoresistance structure comprises:

a first ferromagnetic layer of which magnetization direction is varied by an applied magnetic field;

the tunneling barrier layer formed on the first ferromagnetic layer;

a second ferromagnetic layer formed on the tunneling barrier layer, the second ferromagnetic layer of which magnetization direction is fixed; and a anti-ferromagnetic layer formed on the second ferromagnetic layer, the anti-ferromagnetic layer for fixing the magnetization direction of the second ferromagnetic layer.

18. The device of claim 16, wherein the magnetoresistance structure comprises:

anti-ferromagnetic layer;

a first ferromagnetic layer formed on the anti-ferromagnetic layer, the first ferromagnetic layer of which magnetization direction is fixed by the anti-ferromagnetic layer;

the tunneling barrier layer formed on the first ferromagnetic layer; and a second ferromagnetic layer formed on the tunneling barrier layer, the second ferromagnetic layer of which magnetization direction is varied by an applied magnetic field.

* * * * *